United States Patent
Quan et al.

(10) Patent No.: US 8,476,950 B2
(45) Date of Patent: Jul. 2, 2013

(54) HIGH-SPEED LATCH CIRCUIT

(75) Inventors: Yong Quan, Chengdu (CN); Guosheng Wu, Chengdu (CN)

(73) Assignee: IPGoal Microelectronics (SiChuan) Co., Ltd., Chengdu, Sichuan Province (CN)

( * ) Notice: Subject to any disclaimer, the term of this patent is extended or adjusted under 35 U.S.C. 154(b) by 19 days.

(21) Appl. No.: 13/224,098

(22) Filed: Sep. 1, 2011

(65) Prior Publication Data
US 2012/0068751 A1    Mar. 22, 2012

(30) Foreign Application Priority Data
Sep. 21, 2010 (CN) .......................... 2010 1 0288376

(51) Int. Cl.
*H03K 3/356* (2006.01)
(52) U.S. Cl.
USPC ........................................ 327/208

(58) Field of Classification Search
USPC ................. 327/199–201, 208–212, 214, 215, 327/218
See application file for complete search history.

(56) References Cited

U.S. PATENT DOCUMENTS
2009/0231008 A1* 9/2009 Sekine et al. ................ 327/202
* cited by examiner

*Primary Examiner* — Lincoln Donovan
*Assistant Examiner* — Sibin Chen

(57) ABSTRACT

A high-speed latch circuit includes a latching unit for latching an inputted signal, a signal input unit connected to the latching unit and a clock control unit connected to the signal input unit. The clock control unit includes a first switch element, a second switch element connected to the first switch element and an inverter connected to the second switch element. The first switch element and the inverter are both connected to a clock signal input end. The high-speed latch circuit of the present invention has a simple circuit structure, shortens the triggering time of the signal and reduces chances of wrong triggering.

9 Claims, 2 Drawing Sheets

HIGH-SPEED LATCH CIRCUIT

BACKGROUND OF THE PRESENT INVENTION

1. Field of Invention

The present invention relates to a latch circuit, and more particularly to a high-speed latch circuit having a short triggering time.

2. Description of Related Arts

Latching is temporarily storing signals to maintain some certain electrical level. In a latch, an output end stays in a same state free from a changing state of an input end. Only when there is a latch signal, the inputted state will be stored and outputted. The state of the output end does not change until an arrival of a next latch signal.

For a high-speed latch circuit, in a half cycle of triggering signal, it is necessary for an inputted signal to keep steady. Once the integrity of the inputted signal is interfered by other factors, it may cause wrong triggerings.

SUMMARY OF THE PRESENT INVENTION

Thus, it is necessary to provide a high-speed latch circuit having a short triggering time.

A high-speed latch circuit comprises a latching unit for latching an inputted signal, a signal input unit connected to the latching unit and a clock control unit connected to the signal input unit. The clock control unit comprises a first switch element, a second switch element connected to the first switch element and an inverter connected to the second switch element. A clock signal input end is connected to the first switch element and the inverter.

Compared to the prior art, the high-speed latch circuit of the present invention has a simple structure, shortens the signal triggering time and reduces the chance of wrong triggerings.

DETAILED DESCRIPTION OF THE PREFERRED EMBODIMENT

Figure 1:
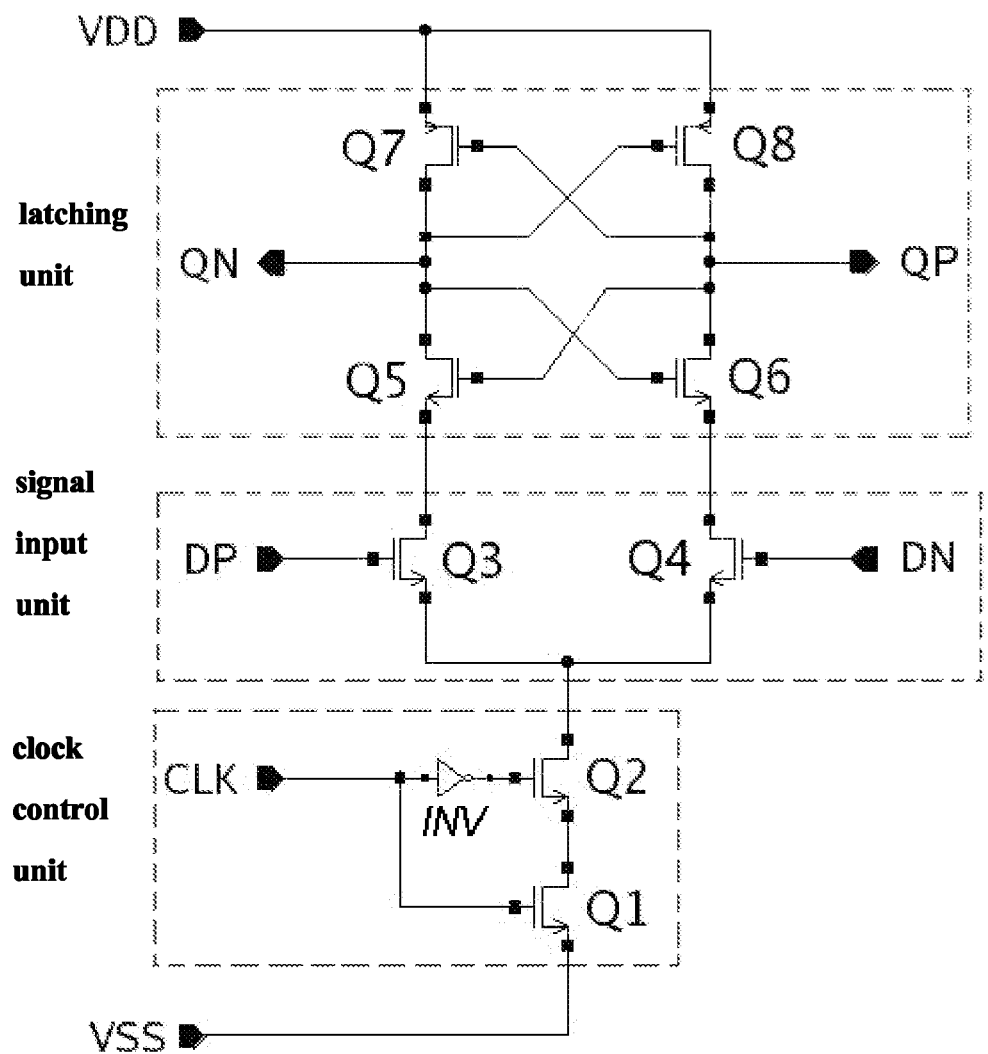
FIG. 1 is a circuit diagram of a high-speed latch circuit according to a preferred embodiment of the present invention.

Referring to FIG. 1 of the drawings, a high-speed latch circuit, according to a preferred embodiment of the present invention, comprises a latching unit, a signal input unit connected to the latching unit and a clock control unit connected to the signal input end.

The clock control unit comprises a clock signal input end CLK, an inverter INV connected to the clock signal input end CLK, a first switch element connected to the clock signal input end CLK and a second switch element connected to the inverter INV.

The signal input unit comprises a first signal input end DP, a third switch element connected to the first signal input end DP, a second signal input end DN and a fourth switch element connected to the second signal input end DN.

The latching unit comprises a fifth switch element, a sixth switch element, a seventh switch element, an eighth switch element, a first signal output end QN and a second signal output end QP.

According to the preferred embodiment, the first switch element comprises a first FET Q1, the second switch element comprises a second FET (Field Effect Transistor) Q2, the third switch element comprises a third FET Q3, the fourth switch element comprises a fourth FET Q4, the fifth switch element comprises a fifth FET Q5, the sixth switch element comprises a sixth FET Q6, the seventh switch element comprises a seventh FET Q7, the eighth switch element comprises an eighth FET Q8. The first FET Q1, the second FET Q2, the third FET Q3, the fourth FET Q4, the fifth FET Q5 and the sixth FET Q6 are NMOS (N-channel MOSFET (metal-oxide-semiconductor field-effect transistor)), while the seventh FET Q7 and the eighth FET Q8 are PMOS (p-channel MOSFET (metal-oxide-semiconductor field-effect transistor)). In other preferred embodiments, the switch elements can be exchanged with other switch elements or circuits having same functions when needed.

According to the preferred embodiment of the present invention, the high-speed latch circuit has the following specific connection relationships: the clock signal input end CLK of the clock control unit is respectively connected to a gate electrode of the first FET Q1 and an input end of the inverter INV; the first FET Q1 has a source electrode connected to a ground terminal VSS and a drain electrode connected to the source electrode of the second FET Q2; the second FET Q2 has a gate electrode connected to an output end of the inverter INV and a drain electrode connected to a source electrode of the third FET Q3 and a source electrode of the fourth FET Q4 of the signal input unit. The third FET Q3 has a gate electrode connected to the first signal input end DP and a drain electrode connected to a source electrode of the fifth FET Q5 of the latching unit. The fourth FET Q4 has a gate electrode connected to the second signal input end DN and a drain electrode connected to a source electrode of the sixth FET Q6 of the latching unit. The first signal output end QN is connected to a drain electrode of the fifth FET Q5, a gate electrode of the sixth FET Q6, a drain electrode of the seventh FET Q7 and a gate electrode of the eighth FET Q8. The second signal output end QP is connected to a gate electrode of the fifth FET Q5, a drain electrode of the sixth FET Q6, a gate electrode of the seventh FET Q7 and a drain electrode of the eighth FET Q8. A source electrode of the seventh FET Q7 and a source electrode of the eighth FET Q8 are both connected to a power supply terminal VDD.

Figure 2:
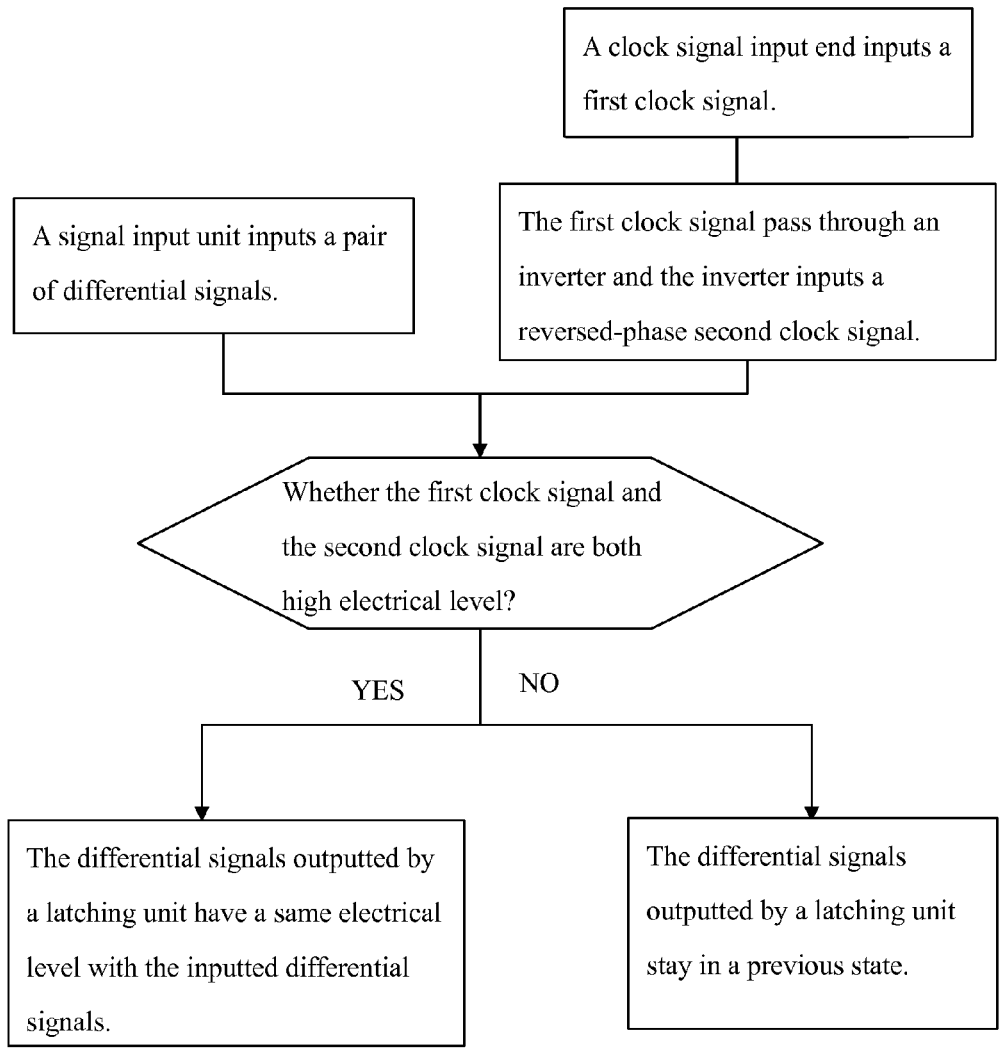
FIG. 2 is a sketch view of working principles of the high-speed latch circuit according to the preferred embodiment of the present invention.

Referring to FIG. 2 of the drawings, according to the preferred embodiment of the present invention, the high-speed latch circuit has the following working principles: when the clock signal input end CLK inputs a first clock signal to the first FET Q1 and the inverter INV, the first clock signal passes through the inverter INV and the inverter INV outputs a reversed-phase second clock signal to the second FET Q2, and thus causes a certain delay between the second clock signal and the first clock signal. Only when the first clock signal and the second clock signal are both at high electrical level, the first FET Q1 and the second FET Q2 conduct, and the clock control unit is active; when either one of the first clock signal and the second clock signal is at low electrical level, the clock control unit is inactive.

The first signal input end DP and the second signal input end DN of the signal input unit cooperatively input a first pair of differential signals. And the first pair of differential signals is latched by the latching unit. When the clock control unit is active, an enable signal is produced and triggering is accomplished, wherein a second pair of differential signals is cooperatively outputted by the first signal output end QN and the second signal output end QP of the latching unit and has a same electrical level with the first pair of differential signals;

when the clock control unit is inactive, the second pair of differential signals outputted by the first signal output end QN and the second signal output end QP stays in a previous state until an arrival of a next active state of the clock control unit.

Thus, according to the prior art, a triggering time of a signal is a high electrical level time of a clock signal, that is, a half of a clock cycle. While the present invention shortens the triggering time of the signal into a fixed relative time delay, that is the delay between the second clock signal and the first clock signal. And in most cases, the delay is far less than the half of the clock cycle. The shorter triggering time means faster answering speed.

The high-speed latch circuit of the present invention has a simple circuit structure, shortens the triggering time of the signal and reduces chances of wrong triggering.

What is claimed is:

1. A high-speed latch circuit, comprising a latching unit for latching an inputted signal, a signal input unit connected to said latching unit and a clock control unit connected to said signal input unit, wherein said clock control unit comprises a first switch element, a second switch element connected to said first switch element and an inverter connected to said second switch element, and a clock signal input end is connected to both said first switch element and said inverter, wherein said first switch element comprises a first FET, said second switch element comprises a second FET, wherein a gate electrode of said first FET and an input end of said inverter are both connected to said clock signal input end, a source electrode of said first FET and a ground terminal are connected, a drain electrode of said first FET and a source electrode of said second FET are connected, a gate electrode of said second FET and an output end of said inverter are connected, and a drain electrode of said second FET is connected to said signal input unit.

2. The high-speed latch circuit, as recited in claim 1, wherein a first clock signal is inputted by said clock signal input end to said first FET and said inverter, said first clock signal passes through said inverter and a reversed-phase second clock signal is outputted by said inverter to said second FET.

3. The high-speed latch circuit, as recited in claim 2, wherein when said first clock signal and said second clock signal are both at high electrical level, said first FET and said second FET both conduct and said clock control unit is active; when either one of said first clock signal and said second clock signal is at low electrical level, said clock control unit is inactive.

4. The high-speed latch circuit, as recited in claim 1, wherein said signal input unit comprises a first signal input end and a second signal input end, said latching unit comprises a first signal output end and a second signal output end, a first pair of differential signals are cooperatively inputted by said first signal input end and said second signal input end, and a second pair of differential signals are cooperatively outputted by said first signal output end and said second signal output end.

5. The high-speed latch circuit, as recited in claim 2, wherein said signal input unit comprises a first signal input end and a second signal input end, said latching unit comprises a first signal output end and a second signal output end, a first pair of differential signals are cooperatively inputted by said first signal input end and said second signal input end, and a second pair of differential signals are cooperatively outputted by said first signal output end and said second signal output end.

6. The high-speed latch circuit, as recited in claim 3, wherein said signal input unit comprises a first signal input end and a second signal input end, said latching unit comprises a first signal output end and a second signal output end, a first pair of differential signals are cooperatively inputted by said first signal input end and said second signal input end, and a second pair of differential signals are cooperatively outputted by said first signal output end and said second signal output end.

7. The high-speed latch circuit, as recited in claim 4, wherein when said clock control unit is active, said second pair of differential signals outputted by said first signal output end and said second signal output end has a same electrical level with said first pair of differential signals; when said clock control unit is inactive, said second pair of differential signals outputted by said first signal output end and said second signal output end stays in a previous state until an arrival of a next active state of said clock control unit.

8. The high-speed latch circuit, as recited in claim 5, wherein when said clock control unit is active, said second pair of differential signals outputted by said first signal output end and said second signal output end has a same electrical level with said first pair of differential signals; when said clock control unit is inactive, said second pair of differential signals outputted by said first signal output end and said second signal output end stays in a previous state until an arrival of a next active state of said clock control unit.

9. The high-speed latch circuit, as recited in claim 6, wherein when said clock control unit is active, said second pair of differential signals outputted by said first signal output end and said second signal output end has a same electrical level with said first pair of differential signals; when said clock control unit is inactive, said second pair of differential signals outputted by said first signal output end and said second signal output end stays in a previous state until an arrival of a next active state of said clock control unit.

* * * * *